US012754257B2

(12) United States Patent
Han et al.

(10) Patent No.: US 12,754,257 B2
(45) Date of Patent: Oct. 6, 2026

(54) D2D SPATIAL UNDERSTANDING WITH ELECTRIC MAGNETS

(71) Applicant: Intel Corporation, Santa Clara, CA (US)

(72) Inventors: Ke Han, Shanghai (CN); Xiaodong Cai, Shanghai (CN); Shouwei Sun, Shanghai (CN); Hemin Han, Shanghai (CN); Lu Wang, Shanghai (CN)

(73) Assignee: INTEL CORPORATION, Santa Clara, CA (US)

( * ) Notice: Subject to any disclaimer, the term of this patent is extended or adjusted under 35 U.S.C. 154(b) by 248 days.

(21) Appl. No.: 18/370,409

(22) Filed: Sep. 20, 2023

(65) Prior Publication Data

US 2025/0012874 A1 Jan. 9, 2025

(30) Foreign Application Priority Data

Jul. 3, 2023 (WO) ................ PCT/CN2023/105468

(51) Int. Cl.
*G01R 33/02* (2006.01)

(52) U.S. Cl.
CPC .................................... *G01R 33/02* (2013.01)

(58) Field of Classification Search
CPC ................ G01R 33/02; G01R 33/0206; G01R 33/025; G01R 33/038; G01R 33/028; G01R 35/00; G01R 33/0094; G06F 2115/00; G06F 2115/10; G06F 2115/12
See application file for complete search history.

(56) References Cited

U.S. PATENT DOCUMENTS

| | | | | |
|---|---|---|---|---|
| 2013/0018628 | A1 * | 1/2013 | Parco .................. | H04M 1/0245 324/207.22 |
| 2014/0076051 | A1 * | 3/2014 | Ma .......................... | G01P 15/18 73/514.29 |
| 2014/0184505 | A1 * | 7/2014 | Fullerton ................ | A63F 13/21 345/158 |
| 2016/0359526 | A1 * | 12/2016 | Pellew ..................... | H04B 5/24 |
| 2020/0387197 | A1 | 12/2020 | Itoh et al. | |
| 2021/0011520 | A1 * | 1/2021 | Bhat ..................... | G06F 1/1679 |

OTHER PUBLICATIONS

The extended European search report for EP Application No. 23217544.8, dated Jun. 19, 2024, 7 pages.

* cited by examiner

*Primary Examiner* — Alvaro E Fortich
(74) *Attorney, Agent, or Firm* — East IP P.C.

(57) ABSTRACT

The present application provides a system including a plurality of components to be mounted to a first device in a preset layout and generate a magnetic field; a magnetometer integrated with a second device to detect the magnetic field to generate reading data associated with the magnetic field at the second device; and a processor configured to determine a position of the second device relative to the first device based on the reading data and the preset layout of the plurality of components.

20 Claims, 10 Drawing Sheets

D2D SPATIAL UNDERSTANDING WITH ELECTRIC MAGNETS

CROSS-REFERENCE TO RELATED APPLICATION

This application claims priority to International Patent Application No. PCT/CN2023/105468, filed on Jul. 3, 2023 and titled "LOW-COST ROBUST D2D SPATIAL UNDERSTANDING WITH ELECTRIC MAGNETS", the content of which is incorporated herein by reference in its entirety.

TECHNICAL FIELD

Embodiments described herein generally relate to Device to Device (D2D) communication, and more specifically to D2D spatial understanding with electric magnets.

BACKGROUND

D2D solutions allow different devices to communicate with each other. Intel® Unison™ is an example of currently available D2D solutions.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
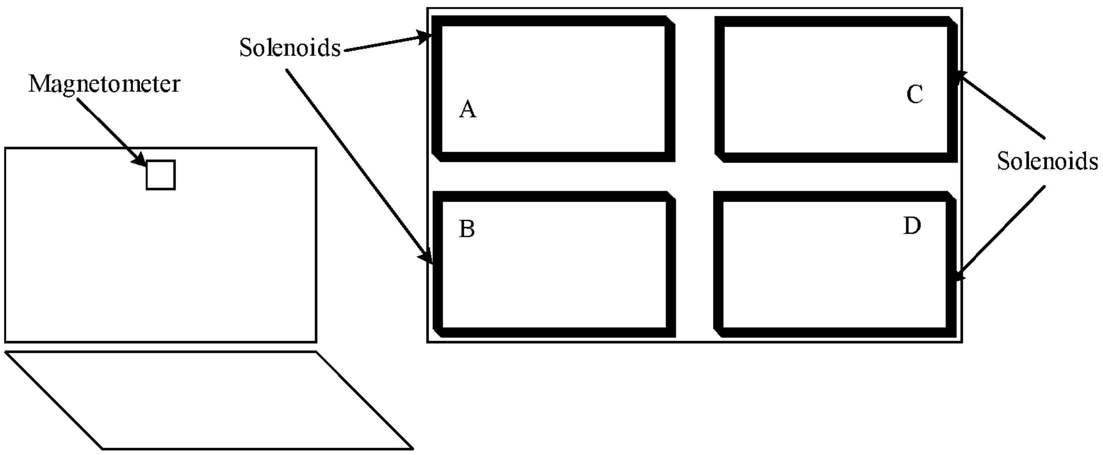
FIG. 1 illustrates an example architecture for D2D spatial understanding with magnetic coils according to some embodiments of the present disclosure.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DETAILED DESCRIPTION

Various aspects of the illustrative embodiments will be described using terms commonly employed by those skilled in the art to convey the substance of the disclosure to others skilled in the art. However, it will be apparent to those skilled in the art that many alternate embodiments may be practiced using portions of the described aspects. For purposes of explanation, specific numbers, materials, and configurations are set forth in order to provide a thorough understanding of the illustrative embodiments. However, it will be apparent to those skilled in the art that alternate embodiments may be practiced without the specific details. In other instances, well-known features may have been omitted or simplified in order to avoid obscuring the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

In D2D solutions, one key problem is spatial understanding from one device to another device. For example, one device may be a laptop and another device may be an external display. With spatial understanding, many novel usages can be enabled in laptop side, including arranging desktops automatically, determining when to connect/disconnect, tuning human presence settings, determining user posture/gaze, and the like.

To enable spatial understanding, two technologies may be considered: an Ultra Wide Band (UWB) ranging based solution and a Visual Simultaneous Localization and Mapping (SLAM) based solution. For the UWB ranging based solution, devices such as phone, laptop or external display are all armed with an UWB component and spatial relationships between the devices can be determined by UWB ranging and angle of arrival (AOA) measurements. For the Visual SIAM based solution, devices such as phone, laptop or external display are all armed with a camera and spatial relationships between the devices can be determined by utilizing same landmarks extracted from different camera images.

Technically, the UWB ranging based solution and the Visual SLAM based solution are all feasible solutions. However, the cost of these solution is high as they require additional infrastructure setup on the laptop and the external display; the solutions are not robust, e.g. the UWB ranging based solution cannot achieve three dimensional (3D) spatial understanding by only using the UWB ranging and horizontal AoA, and the Visual SLAM based solution may be not robust since the camera could be blocked by a mechanical shutter or sticker; and communication between the devices may be complicated as additional communication protocols may be needed for UWB/camera data transfer.

According to the present disclosure, in order to achieve spatial understanding, it is proposed to add electric magnets (e.g. magnetic coils) to the display panel, power on or off the electric magnets according to a specific predefined power-on-off pattern right after the display panel is connected to the laptop, detect a magnetic field at the laptop by an integrated magnetometer at the laptop side to generate reading data associated with the magnetic field, and analyze the reading data to get a spatial understanding result.

FIG. 1 illustrates an example architecture for D2D spatial understanding with magnetic coils according to some embodiments of the present disclosure. As shown in FIG. 1, a laptop and an external display may perform a D2D communication/interaction, a magnetometer is integrated on the laptop, and four magnetic coils (solenoids) are distributed in an array on a panel of the external display. When a current flows through the coils, a magnetic field may be generated by the coils, the magnetometer may detect the magnetic field at the laptop to generate reading data associated with the magnetic field at the laptop, and a processor coupled with the laptop or integrated in the laptop may determine a position of the laptop relative to the external display based on the reading data from the magnetometer and a layout of the magnetic coils on the panel of the external display. The layout of the magnetic coils may include positions of the magnetic coils relative to the external display, winding directions of the magnetic coils, a direction of the current flowing through the magnetic coils, or other parameters about the setting of the magnetic coils. The layout of the magnetic coils may be preset and provided to the laptop, so that the processor integrated in or coupled with the laptop may determine the position of the laptop relative to the external display based on the reading data from the magnetometer and the layout of the magnetic coils. In this way, the laptop may achieve the spatial understanding so as to perform D2D interaction with the external display.

Figure 2:
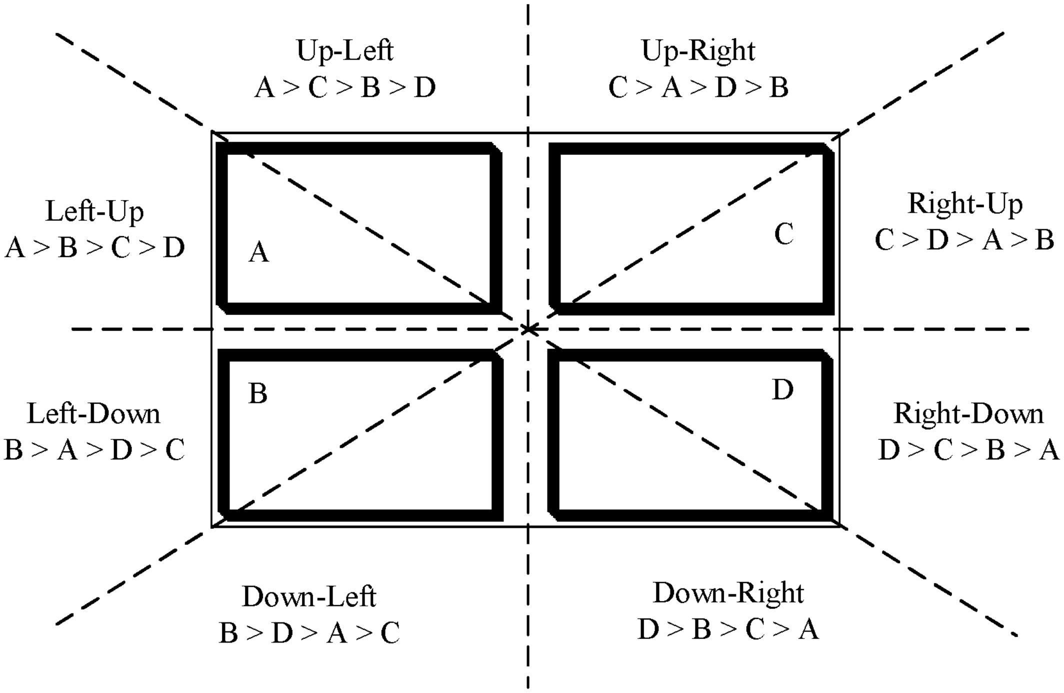
FIG. 2 illustrates an example process for determining a position of a laptop relative to an external display based on reading data of a magnetometer integrated with the laptop according to some embodiments of the present disclosure.

FIG. 2 illustrates an example process for determining a position of a laptop relative to an external display based on reading data of a magnetometer integrated with the laptop according to some embodiments of the present disclosure.

In the embodiments, four magnetic coils A, B, C, D are distributed in an array on a panel of the external display and configured to be powered on or off in sequence according to a predefined power-on-off pattern, e.g. when the external display is connected to the laptop. For example, the predefined power-on-off pattern may be A (0.25 s)→B (0.25 s)→C (0.25 s)→D (0.25 s), which means that during one second after connection of the external display, coil A is powered on during the first 0.25 s and then powered off, coil B is powered on during the second 0.25 s and then powered off, coil C is powered on during the third 0.25 s and then powered off, and finally coil D is powered on during the last 0.25 s and then powered off. In this case, the magnetometer integrated on the laptop may detect four intensity peaks of the magnetic field and generate reading data including a changing pattern of intensity peaks of the magnetic field, and then a processor coupled with the laptop or integrated in the laptop may determine a position of the laptop relative to the external display based on the changing pattern of intensity peaks of the magnetic field and the layout of the magnetic coils on the panel of the external display.

For example, in scenario 1, the changing pattern of intensity peaks of the magnetic field is A>C>B>D, which means that the intensity peak of the magnetic field when coil A is powered on is larger than the intensity peak of the magnetic field when coil C is powered on, the intensity peak of the magnetic field when coil C is powered on is larger than the intensity peak of the magnetic field when coil B is powered on, the intensity peak of the magnetic field when coil B is powered on is larger than the intensity peak of the magnetic field when coil D is powered on. In this scenario, the processor may determine that the laptop is located at an up-left side of the external display. Likewise, for example, in scenario 2, the changing pattern of intensity peaks of the magnetic field is C>A>D>B, which means that the intensity peak of the magnetic field when coil C is powered on is larger than the intensity peak of the magnetic field when coil A is powered on, the intensity peak of the magnetic field when coil A is powered on is larger than the intensity peak of the magnetic field when coil D is powered on, the intensity peak of the magnetic field when coil D is powered on is larger than the intensity peak of the magnetic field when coil B is powered on. In this scenario, the processor may determine that the laptop is located at an up-right side of the external display. As illustrated in FIG. 2, there may be eight different scenarios for determining eight different positions of the laptop relative to the external display.

With the proposed solution for spatial understanding as discussed with reference to FIG. 2, it is just needed to attach electric magnets onto the external display without the need of UWB components or cameras on the external display. The solution is simple and power efficient as no additional communication between the laptop and the external display is needed and only one second power-on for the magnetic coils is needed after every connection between the laptop and the display. The solution is also a very reliable solution which is immune to magnetic interference and does not need magnetometer calibration. In some embodiments, the magnetic coils may be even attached to a traditional display monitor as peripherals of the display monitor, so the proposed solution may be flexible to be applied to traditional devices.

Figure 3:
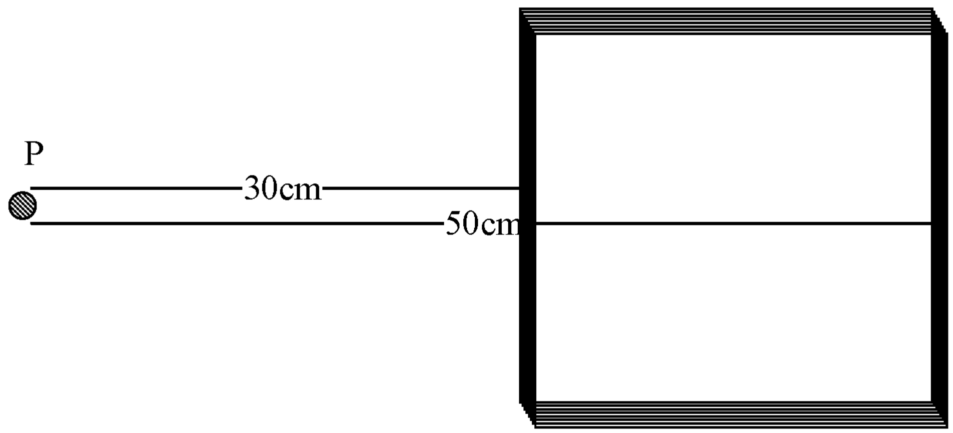
FIG. 3 illustrates how to calculate a magnetic field intensity at a point generated by a magnetic coil.

FIG. 3 illustrates how to calculate a magnetic field intensity at a point generated by a magnetic coil. The estimation of a current required to provide power to the magnetic coils mounted to the external display will be described with reference to FIG. 3.

The equation used to calculate the magnetic field produced by a current flowing through a coil is given below according to the Biot-Savart law:

$$B=(\mu 0/4\pi)*\int(Idl*r)/r^3$$

where B represents the magnetic field intensity at point P, μ0 is the permeability of free space ($4\pi\times10^{-7}$ Tm/A), I is the current flowing through the coil, dl is an infinitesimal length element of the coil, and r is the distance between the element dl and point P.

For a given magnetic coil in square shape as shown in FIG. 3, approximately each edge of the coil may generate a separated magnetic field as:

$B=\mu 0*I/(2\pi*d)$, where $d$ is the distance from the edge.

Suppose the magnetometer of the laptop is located at point P which is 30 cm away from one edge of the magnetic coil and 50 cm away from another edge of the magnetic coil, and the current flowing through the magnetic coil is 1 A. In this case, one edge of each loop in the magnetic coil may generate a magnetic field with an intensity of 6.67e-7 T at point P, another edge of the loop may generate a magnetic field with an intensity of 4e-7 T in an opposite direction at point P, and thus the total magnetic field at point P may have an intensity of 2.67e-7 T. Earth's magnetic field has an intensity of about 5e-5 T, so if it is desired to generate a magnetic field equal to this level, the magnetic field generated by the magnetic coil may need to be multiplied by about 5e-5/2.67e-7=187.27 times. Suppose there are 100 loops in the magnetic coil, then the current flowing through the magnetic coil should be 1.87 A.

It is noted that the above estimation of the current flowing through the magnetic coil is just a rough estimation as an example. Based on practical needs and the sensitivity of the magnetometer, the generated magnetic field can be much smaller. Also, when magnetic coils of a bigger size are used, the required current may be smaller.

As described above with reference to FIG. 1 to FIG. 3, according to some embodiments of the present disclosure, a system for D2D solutions is proposed and may include a plurality of components to be mounted to a first device in a preset layout and generate a magnetic field; a magnetometer integrated with a second device to detect the magnetic field to generate reading data associated with the magnetic field at the second device; a processor configured to determine a position of the second device relative to the first device based on the reading data and the preset layout of the plurality of components. The preset layout of the plurality of components may include parameters about the setting of the plurality of components, e.g. positions of the components relative to the first device, vector directions of the magnetic fields to be generated by the components, etc. For example, the first device may be a display monitor external to a laptop and the second device is the laptop installed with the processor, and the plurality of components may be mounted to a bezel of a display panel of the display monitor at a plurality of corners of the display panel, or alternatively, one or more of the plurality of components may be mounted to a stand of the display monitor.

In some embodiments, the plurality of components may be magnetic coils and configured to be powered on or off in sequence according to a predefined power-on-off pattern, e.g. when the first device is connected to the second device. In this case, the reading data of the magnetometer may include a changing pattern of intensity peaks of the magnetic field at the second device, and the preset layout of the plurality of components may include the predefined power-on-off pattern. The magnetic coils may have a same winding direction. Furthermore, the magnetic coils may be configured to be powered on with a same direct current to avoid high frequency interference.

In some embodiments, a magnet may be disposed at a center of each magnetic coil to increase the magnetic field generated by the magnetic coil. The magnetic coils may be integrated with the first device or mounted to the first device as peripherals.

It is also noted that depending on practical applications, the number of magnetic coils mounted to the first device may be increased or decreased, the winding direction of the magnetic coils may be changed, and the predefined power-on-off pattern of the magnetic coils may be changed.

Figure 4:
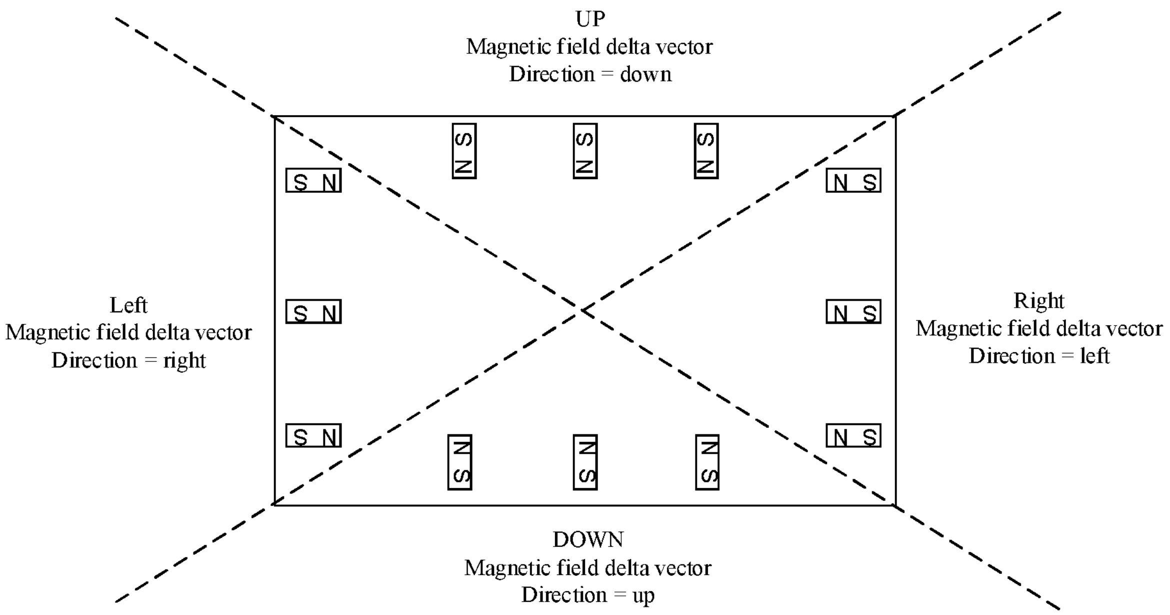
FIG. 4 illustrates an example architecture for D2D spatial understanding with permanent magnets according to some embodiments of the present disclosure.

According to some embodiments of the present disclosure, instead of magnetic coils, permanent magnets may be mounted to the external display, as shown in FIG. 4 which illustrates an example architecture for D2D spatial understanding with permanent magnets. In the embodiments, there is no need to power on or off the permanent magnets. Instead of reading a changing pattern of intensity peaks of the magnetic field at the laptop, the magnetometer may read a magnetic field vector direction of the magnetic field at the laptop, and thus the processor may determine a position of the laptop relative to the external display based on the magnetic field vector direction of the magnetic field at the laptop and the layout of the permanent magnets on the external display. The layout of the permanent magnets may include parameters about the setting of the permanent magnets, e.g. positions of the permanent magnets relative to the external display, directions of magnetic pols of the permanent magnets, etc.

As illustrated in FIG. 4, three permanent magnets are mounted on each edge of the display panel and the S-pole of each permanent magnet is further away from the center of the display panel than the N-pole of the permanent magnet. The layout of the permanent magnets on the external display may be preset and provided to the laptop, so that the processor integrated in or coupled with the laptop may determine a position of the laptop relative to the external display based on the magnetic field vector direction of the magnetic field at the laptop and the layout of the permanent magnets on the external display.

For example, when the magnetometer detects that the magnetic field vector direction of the magnetic field at the laptop is downward, it can be determined that the laptop is located at an upside of the external display; when the magnetometer detects that the magnetic field vector direction of the magnetic field at the laptop is upward, it can be determined that the laptop is located at a downside of the external display; when the magnetometer detects that the magnetic field vector direction of the magnetic field at the laptop is toward left, it can be determined that the laptop is located at a right side of the external display; when the magnetometer detects that the magnetic field vector direction of the magnetic field at the laptop is toward right, it can be determined that the laptop is located at a left side of the external display.

It is noted that the positions, the number and the direction of the permanent magnets may vary depending on practical application, which is similar to the above described magnetic coil based solution. On the other hand, for the permanent magnet based solution, the direction of the magnetic field generated by the permanent magnets may be interfered by environmental magnetic field, so the magnetometer on the laptop may need to be well calibrated for accurate spatial understanding. Also, depending on the length of permanent magnets, there may be a detection zone on each edge of the display panel, and mispredictions may occur outside the detection zone.

As a strong magnetic field may be generated during the spatial understanding, it is preferable to consider electromagnetic compatibility (EMC) in the above solutions. There are mature mechanisms to protect electric devices from generated magnetic fields. For example, for the above solutions, the following mechanisms can be considered in EMC designs: moving magnetic coils as far as possible from the display panel PCB; using a direct current to power on the magnetic coils to avoid high frequency interference; and/or using electromagnetic shielding to cover IC chips or active components on PCB so as to protect sensitive signals from external electromagnetic signals. Anyway, it is noted that the EMC design is not in scope of this disclosure, the above examples are just illustrating that there are available methods to handle the interference from magnetic coils used in this disclosure.

Figure 5:
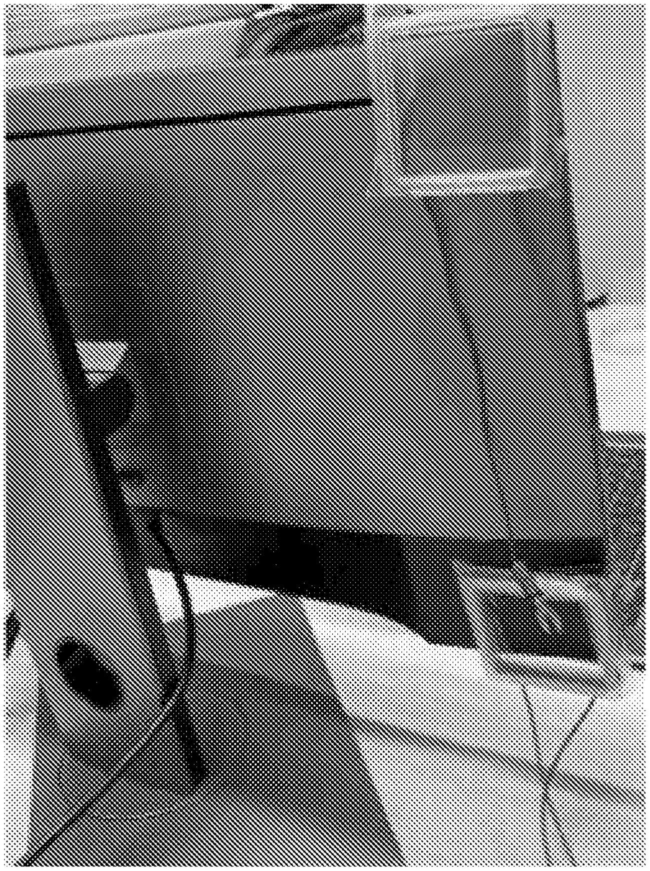
FIG. 5 illustrates an experimental setup for tests according to some embodiments of the present disclosure.
Figure 6:
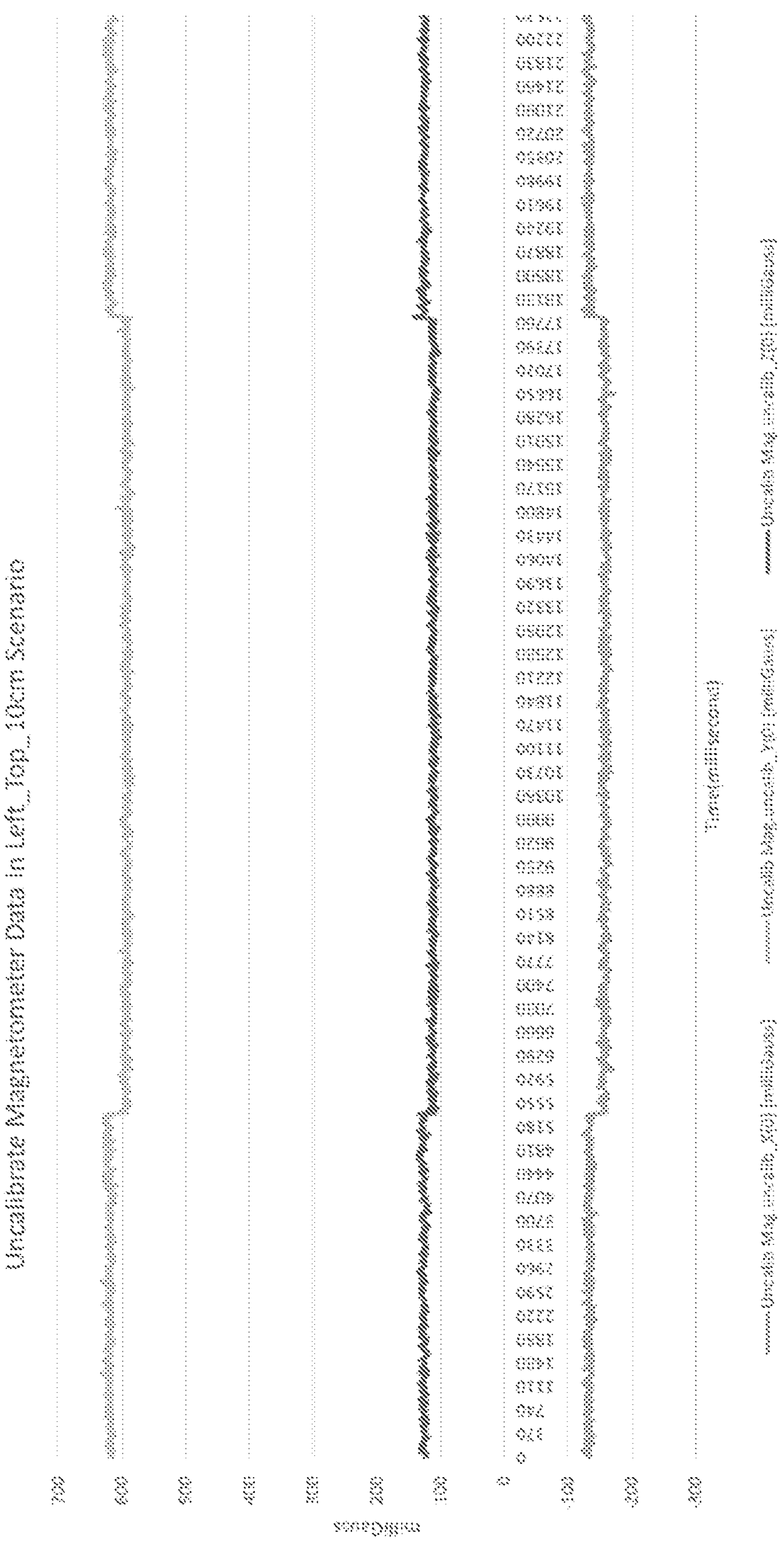
FIGS. 6-10 illustrate detailed magnetometer readings for test scenarios according to some embodiments of the present disclosure.

In order to illustrate the effectiveness of the proposed solution, tests have been performed with two magnetic coils. The magnetic coils were used for high school physics experiments and were attached to the left side of the back of a display monitor, as shown in FIG. 5. During tests, the two coils were connected to a DC power supply with voltage and current of 17.48V and 2.565 A. The tests were performed on four laptop positions (with reference to the illustration of FIG. 1 for the laptop and the screen):

Test position 1: laptop is 10 cm to the screen left edge;

Test position 2: laptop is 20 cm to the screen left edge;

Test position 3: laptop is 10 cm to the screen right edge;

Test position 4: laptop is 20 cm to the screen right edge.

Table 1 below shows a summary of test results. On the four different test positions, the magnetic coils were manually powered up (left top and left bottom), then the magnetometer reading changes were measured from the laptop side. As shown in Table 1, with the given magnetic coils and given current from the DC power supply, when the laptop is 10 cm and 20 cm away from the left side of the display, powering up of the two magnetic coils can be easily distinguished, but when the laptop is 10 cm and 20 cm away from the right side of the display, no change can be detected (because the laptop is too far away).

TABLE 1

| Laptop test position | Magnetic Coils powered up | Magnetometer reading change | Test Scenario |
|---|---|---|---|
| 10 cm to left edge of display | Left top | 73 mG | 1 |
| | Left bottom | 157 mG | 2 |
| 20 cm to left edge of display | Left top | 20 mG | 3 |
| | Left bottom | 60 mG | 4 |
| 10 cm to right edge of display | Left top | No change observed | 5 |
| | Left bottom | No change observed | 6 |
| 20 cm to right edge of display | Left top | No change observed | 7 |
| | Left bottom | No change observed | 8 |

Figure 7:
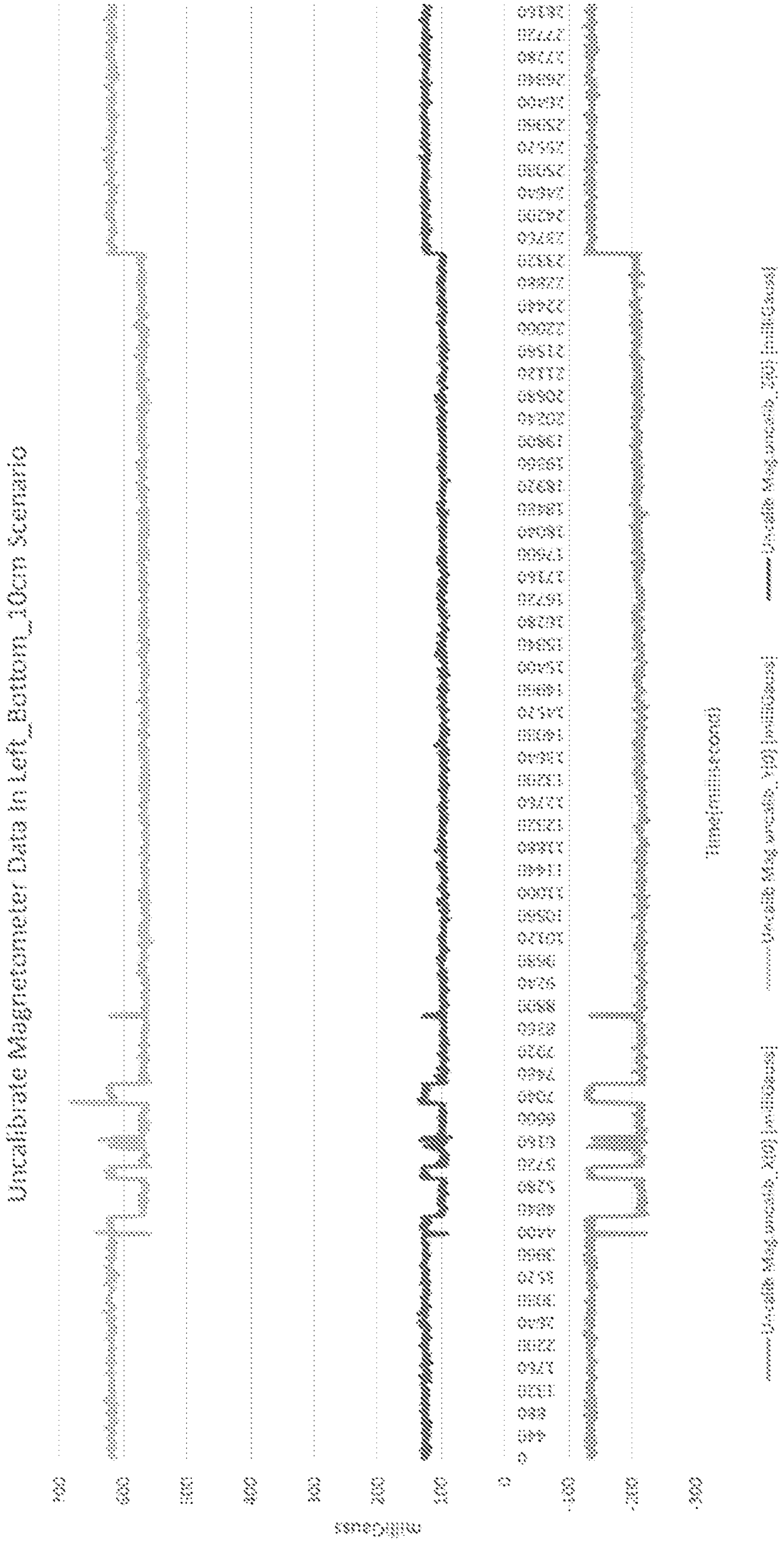
Figure 8:
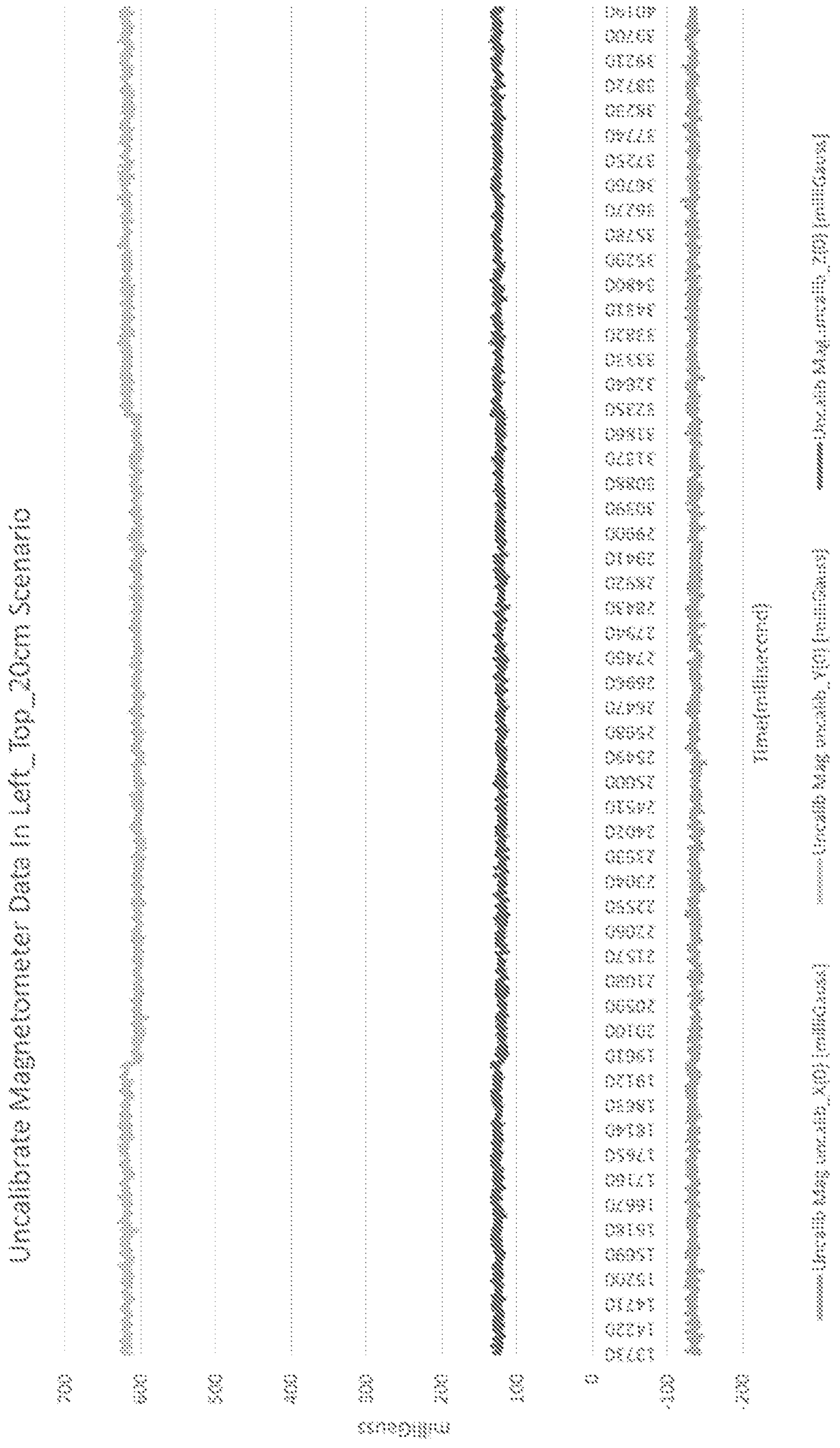
Figure 9:
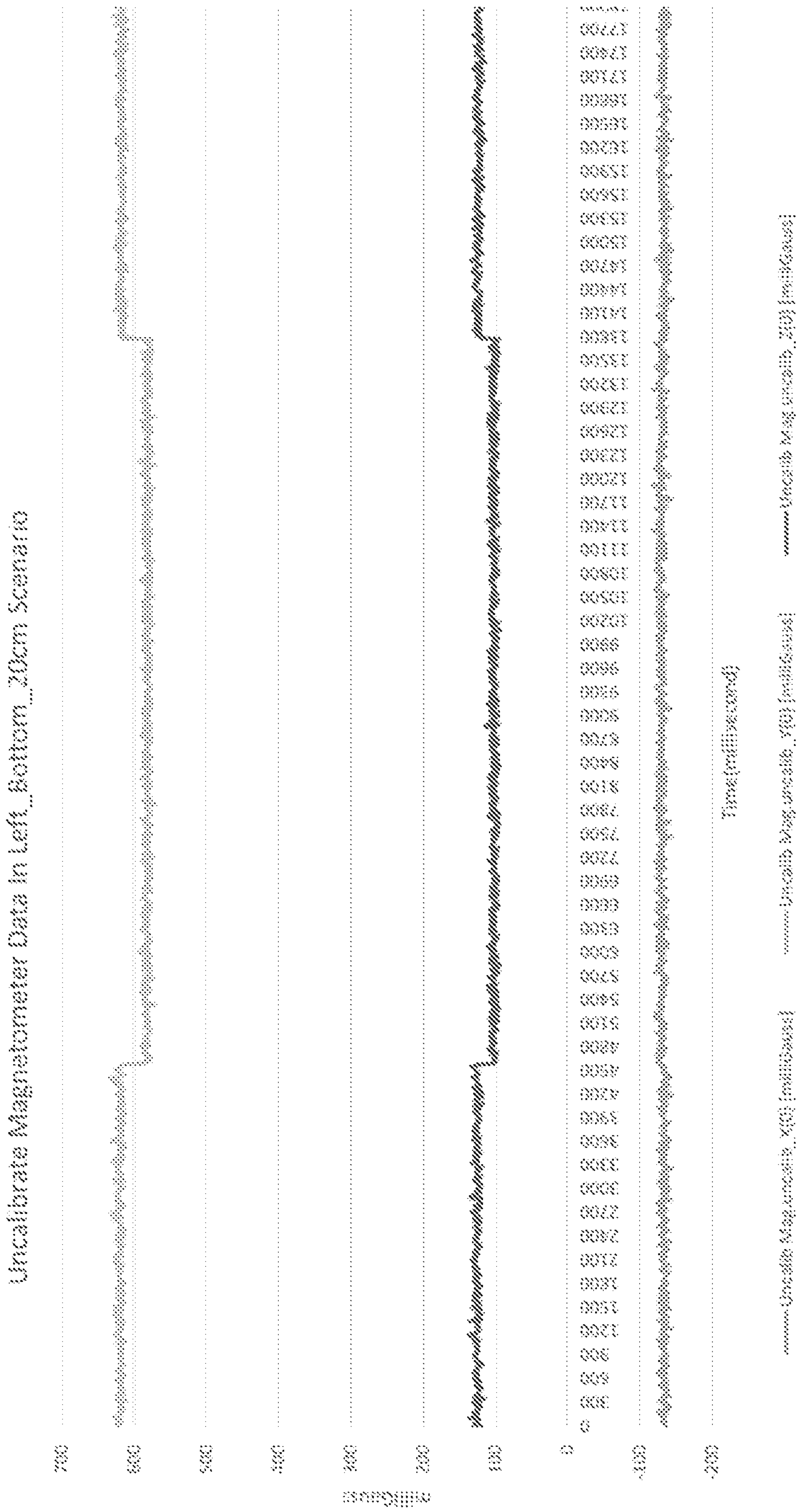
Figure 10:
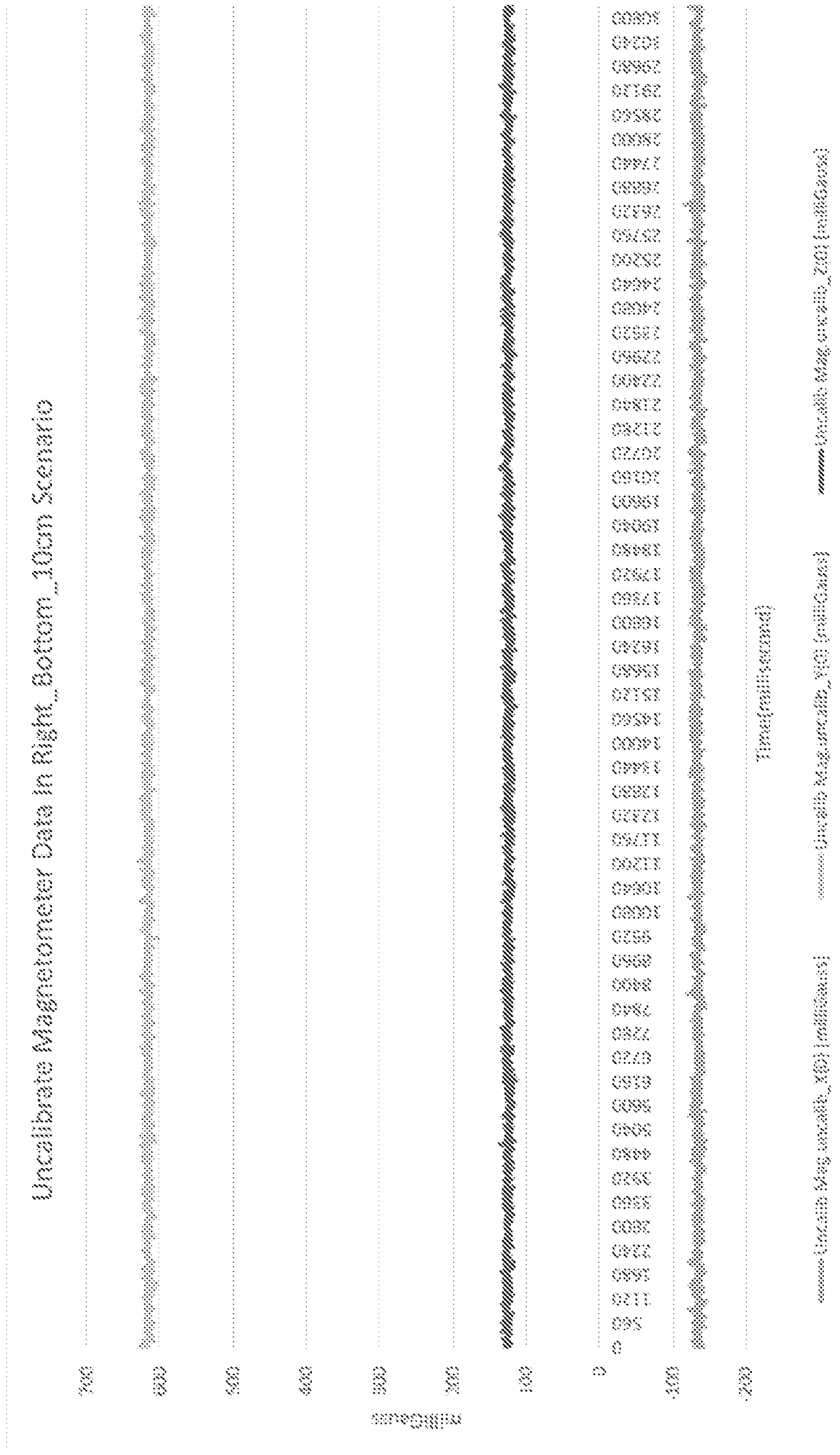

FIGS. 6-10 show the detailed magnetometer reading data for test scenario 1, 2, 3, 4, 6 defined in Table 1 respectively. The magnetometer reading data for scenario 5, 7, 8 are same as scenario 6, and hence are not pasted in the disclosure. In FIG. 7, the spikes are believed to result from manual power connection which is not stable.

The following paragraphs describe examples of various embodiments.

Example 1 includes a system including: a plurality of components to be mounted to a first device in a preset layout and generate a magnetic field; a magnetometer integrated with a second device to detect the magnetic field to generate reading data associated with the magnetic field at the second device; and a processor configured to determine a position of the second device relative to the first device based on the reading data and the preset layout of the plurality of components.

Example 2 includes the system of Example 1, wherein the plurality of components are magnetic coils and configured to be powered on or off in sequence according to a predefined power-on-off pattern; the reading data includes a changing pattern of intensity peaks of the magnetic field at the second device; and the preset layout of the plurality of components includes the predefined power-on-off pattern.

Example 3 includes the system of Example 2, wherein the magnetic coils have a same winding direction.

Example 4 includes the system of Example 2 or 3, wherein a magnet is disposed at a center of each magnetic coil to increase the magnetic field generated by the magnetic coil.

Example 5 includes the system of any of Examples 2 to 4, wherein the plurality of components are integrated with the first device or mounted to the first device as peripherals.

Example 6 includes the system of Example 1, wherein the plurality of components are permanent magnets; and the reading data includes a magnetic field vector direction of the magnetic field at the second device.

Example 7 includes the system of any of Examples 1 to 6, wherein the first device includes a display monitor.

Example 8 includes the system of Example 7, wherein the plurality of components are mounted to a bezel of a display panel of the display monitor at a plurality of corners of the display panel.

Example 9 includes the system of Example 7, wherein one or more of the plurality of components are mounted to a stand of the display monitor.

Example 10 includes the system of any of Examples 1 to 9, wherein the second device includes a laptop installed with the processor.

Example 11 includes a first device including: a plurality of components to be mounted to the first device in a preset layout and generate a magnetic field detectable at a second device to be connected to the first device, wherein the preset layout of the plurality of components is provided for the second device to determine a position of the second device relative to the first device based on the preset layout of the plurality of components and reading data associated with the magnetic field generated by a magnetometer integrated with the second device.

Example 12 includes the first device of Example 11, wherein the plurality of components are magnetic coils and configured to be powered on or off in sequence according to a predefined power-on-off pattern; the reading data includes a changing pattern of intensity peaks of the magnetic field at the second device; and the preset layout of the plurality of components includes the predefined power-on-off pattern.

Example 13 includes the first device of Example 12, wherein the magnetic coils have a same winding direction.

Example 14 includes the first device of Example 12 or 13, wherein a magnet is disposed at a center of each magnetic coil to increase the magnetic field generated by the magnetic coil.

Example 15 includes the first device of any of Examples 12 to 14, wherein the plurality of components are integrated with the first device or mounted to the first device as peripherals.

Example 16 includes the first device of Example 11, wherein the plurality of components are permanent magnets; and the reading data includes a magnetic field vector direction of the magnetic field at the second device.

Example 17 includes the first device of any of Examples 11 to 16, wherein the first device includes a display monitor.

Example 18 includes the first device of Example 17, wherein the plurality of components are mounted to a bezel of a display panel of the display monitor at a plurality of corners of the display panel.

Example 19 includes the first device of Example 17, wherein one or more of the plurality of components are mounted to a stand of the display monitor.

Example 20 includes the first device of any of Examples 11 to 19, wherein the second device includes a laptop installed with the processor.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B"

includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A system comprising:

a plurality of magnetic field generating components to be mounted to a first device in a preset layout and generate a magnetic field detectable at a second device to be connected to the first device, the first device serving as a reference device having a known and stationary position and orientation, the preset layout comprising positions of the plurality of magnetic field generating components relative to the first device and vector directions of magnetic fields to be generated by the plurality of magnetic field generating components;

a magnetometer integrated with the second device to detect the magnetic field to generate reading data associated with the magnetic field at the second device; and a processor configured to determine a position of the second device as a mobile device relative to the first device based on the reading data and the preset layout of the plurality of magnetic field generating components.

2. The system of claim 1, wherein the plurality of magnetic field generating components are magnetic coils and configured to be powered on or off in sequence according to a predefined power-on-off pattern;

the reading data comprises a changing pattern of intensity peaks of the magnetic field at the second device; and the preset layout of the plurality of magnetic field generating components comprises the predefined power-on-off pattern.

3. The system of claim 2, wherein the magnetic coils have a same winding direction.

4. The system of claim 2, wherein a magnet is disposed at a center of each magnetic coil to increase the magnetic field generated by the magnetic coil.

5. The system of claim 2, wherein the plurality of magnetic field generating components are integrated with the first device or mounted to the first device as peripherals.

6. The system of claim 1, wherein the plurality of magnetic field generating components are permanent magnets; and the reading data comprises a magnetic field vector direction of the magnetic field at the second device.

7. The system of claim 1, wherein the first device comprises a display monitor.

8. The system of claim 7, wherein the plurality of magnetic field generating components are mounted to a bezel of a display panel of the display monitor at a plurality of corners of the display panel.

9. The system of claim 7, wherein one or more of the plurality of magnetic field generating components are mounted to a stand of the display monitor.

10. The system of claim 1, wherein the second device comprises a laptop installed with the processor.

11. A first device comprising:

a plurality of magnetic field generating components to be mounted to the first device in a preset layout and generate a magnetic field detectable at a second device to be connected to the first device, the first device serving as a reference device having a known and stationary position and orientation, the preset layout comprising positions of the plurality of magnetic field generating components relative to the first device and vector directions of magnetic fields to be generated by the plurality of magnetic field generating components, wherein the preset layout of the plurality of magnetic field generating components is provided for the second device to determine a position of the second device as a mobile device relative to the first device based on the preset layout of the plurality of magnetic field generating components and reading data associated with the magnetic field generated by a magnetometer integrated with the second device.

12. The first device of claim 11, wherein the plurality of magnetic field generating components are magnetic coils and configured to be powered on or off in sequence according to a predefined power-on-off pattern;

the reading data comprises a changing pattern of intensity peaks of the magnetic field at the second device; and the preset layout of the plurality of magnetic field generating components comprises the predefined power-on-off pattern.

13. The first device of claim 12, wherein the magnetic coils have a same winding direction.

14. The first device of claim 12, wherein a magnet is disposed at a center of each magnetic coil to increase the magnetic field generated by the magnetic coil.

15. The first device of claim 12, wherein the plurality of magnetic field generating components are integrated with the first device or mounted to the first device as peripherals.

16. The first device of claim 11, wherein the plurality of magnetic field generating components are permanent magnets; and the reading data comprises a magnetic field vector direction of the magnetic field at the second device.

17. The first device of claim 11, wherein the first device comprises a display monitor.

18. The first device of claim 17, wherein the plurality of magnetic field generating components are mounted to a bezel of a display panel of the display monitor at a plurality of corners of the display panel.

19. The first device of claim 17, wherein one or more of the plurality of magnetic field generating components are mounted to a stand of the display monitor.

20. The first device of claim 11, wherein the second device comprises a laptop installed with the processor.

* * * * *